(12) United States Patent
Sakong et al.

(10) Patent No.: US 12,336,346 B2
(45) Date of Patent: Jun. 17, 2025

(54) METHOD OF MANUFACTURING LIGHT EMITTING DEVICE PACKAGE AND METHOD OF MANUFACTURING DISPLAY PANEL USING THE SAME

(71) Applicant: SAMSUNG ELECTRONICS CO., LTD., Suwon-si (KR)

(72) Inventors: Tan Sakong, Seoul (KR); Juhyun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 158 days.

(21) Appl. No.: 16/716,752

(22) Filed: Dec. 17, 2019

(65) Prior Publication Data
US 2021/0005794 A1 Jan. 7, 2021

(30) Foreign Application Priority Data
Jul. 5, 2019 (KR) ........................ 10-2019-0081599

(51) Int. Cl.
*H10H 20/01* (2025.01)
*H10H 20/851* (2025.01)
*H10H 20/854* (2025.01)

(52) U.S. Cl.
CPC ........ *H10H 20/854* (2025.01); *H10H 20/851* (2025.01); *H10H 20/0361* (2025.01);
(Continued)

(58) Field of Classification Search
CPC .................. H01L 2933/0041; H10H 20/0361
(Continued)

(56) References Cited

U.S. PATENT DOCUMENTS 6,372,608 B1   4/2002 Shimoda et al.
6,645,830 B2   11/2003 Shimoda et al.
(Continued)

FOREIGN PATENT DOCUMENTS

DE   102011056888   6/2013
DE   112013005899   9/2015
(Continued)

OTHER PUBLICATIONS

Office Action in German Appln. No. 10 2020 108 077.8, mailed on Feb. 2, 2024, 27 pages (with English translation).
(Continued)

*Primary Examiner* — Hsin Yi Hsieh
(74) *Attorney, Agent, or Firm* — Fish & Richardson P.C.

(57) ABSTRACT

A method of manufacturing a light emitting device package and a method of manufacturing a display panel, the method of manufacturing a light emitting device package including forming a semiconductor laminate on a substrate such that the semiconductor laminate has a first conductive semiconductor layer, an active layer, and a second conductive semiconductor layer; separating the semiconductor laminate into semiconductor light emitters, separated from each other, by forming a trench having a predetermined depth in the substrate by etching through the semiconductor laminate in a direction of the first surface of the substrate; forming a molding that fills the trench and insulates the semiconductor light emitters from each other by applying a flexible insulating material to cover the semiconductor light emitters; forming grooves separated from each other by the molding and overlying to the semiconductor light emitters, respectively, by removing the substrate; and forming wavelength converters in the grooves.

12 Claims, 21 Drawing Sheets

(52) U.S. Cl.
CPC ..... *H10H 20/0362* (2025.01); *H10H 20/0363* (2025.01); *H10H 20/0364* (2025.01)

(58) Field of Classification Search
USPC .......................................................... 438/28
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,440,071 B2 | 10/2008 | Hsieh et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 10,153,260 B2 | 12/2018 | Yeon et al. | |
| 2012/0295058 A1 | 11/2012 | Brosnihan et al. | |
| 2013/0048940 A1 | 2/2013 | Sills et al. | |
| 2014/0159064 A1 | 6/2014 | Sakariya et al. | |
| 2014/0267281 A1* | 9/2014 | Heyman | G06T 3/4092 345/428 |
| 2015/0014716 A1 | 1/2015 | von Malm | |
| 2017/0104018 A1* | 4/2017 | Yamazaki | H01L 29/78621 |
| 2017/0141155 A1 | 5/2017 | Hughes et al. | |
| 2017/0236866 A1 | 8/2017 | Lee et al. | |
| 2017/0358562 A1* | 12/2017 | Banna | H01L 25/50 |
| 2018/0047780 A1* | 2/2018 | Yeon | H01L 33/504 |
| 2018/0151543 A1 | 5/2018 | Lee | |
| 2018/0166424 A1* | 6/2018 | Sim | H01L 25/0753 |
| 2018/0175261 A1* | 6/2018 | Yoo | H01L 33/06 |
| 2018/0308420 A1 | 10/2018 | Shin et al. | |
| 2019/0035974 A1 | 1/2019 | Li et al. | |
| 2019/0044040 A1* | 2/2019 | Andrews | H01L 27/156 |
| 2019/0067257 A1 | 2/2019 | Yeon et al. | |
| 2019/0088633 A1* | 3/2019 | Tao | H01L 25/18 |
| 2019/0122592 A1* | 4/2019 | Han | G09G 3/32 |
| 2019/0189595 A1* | 6/2019 | Lee | H01L 27/1214 |
| 2019/0355702 A1* | 11/2019 | Herner | H01L 33/30 |
| 2019/0371779 A1* | 12/2019 | Yeon | H01L 25/18 |
| 2021/0013236 A1* | 1/2021 | Sakong | H01L 27/1214 |

FOREIGN PATENT DOCUMENTS

| | | |
|---|---|---|
| JP | 2018-063399 | 4/2018 |
| KR | 10-2014-0026566 | 3/2014 |
| KR | 10-2015-0069228 A | 6/2015 |
| KR | 10-2015-0102907 | 9/2015 |
| KR | 10-2018-0059249 | 6/2018 |
| KR | 10-2018-0068588 | 6/2018 |
| KR | 10-2018-0078940 | 7/2018 |
| KR | 10-2018-0118090 | 10/2018 |

OTHER PUBLICATIONS

Office Action in Korean Appln. No. 10-2019-0081599, mailed on Mar. 21, 2024, 21 pages (with English translation).

* cited by examiner

A

… (1)

METHOD OF MANUFACTURING LIGHT EMITTING DEVICE PACKAGE AND METHOD OF MANUFACTURING DISPLAY PANEL USING THE SAME

CROSS-REFERENCE TO RELATED APPLICATION(S)

Korean Patent Application No. 10-2019-0081599 filed on Jul. 5, 2019, in the Korean Intellectual Property Office, and entitled: "Method of Manufacturing Light Emitting Device Package and Method of Manufacturing Display Panel Using the Same," is incorporated by reference herein in its entirety.

BACKGROUND

1. Field

Embodiments relate to a method of manufacturing a light emitting device package and a method of manufacturing a display panel using the same.

2. Description of the Related Art

Semiconductor light emitting diodes (LED) have been used as light sources for various electronic products, as well as light sources for lighting devices. For example, semiconductor LED devices may be used as light sources for various types of display panels such as TVs, mobile phones, PCs, laptop PCs, and PDAs.

SUMMARY

The embodiments may be realized by providing a method of manufacturing a light emitting device package, the method including forming a semiconductor laminate on a first surface of a substrate having the first surface and a second surface opposite to the first surface such that the semiconductor laminate has a first conductive semiconductor layer, an active layer, and a second conductive semiconductor layer; separating the semiconductor laminate into a plurality of semiconductor light emitters, separated from each other, by forming a trench having a predetermined depth in the substrate by etching through the semiconductor laminate in a direction of the first surface of the substrate; forming a molding that fills the trench and insulates the plurality of semiconductor light emitters from each other by applying a flexible insulating material to cover the plurality of semiconductor light emitters; forming a plurality of grooves separated from each other by the molding and overlying to the plurality of semiconductor light emitters, respectively, by removing the substrate; and forming a plurality of wavelength converters in the plurality of grooves.

The embodiments may be realized by providing a method of manufacturing a light emitting device package, the method including forming a plurality of semiconductor light emitters that are separated from each other, by stacking a first conductive semiconductor layer, an active layer, and a second conductive semiconductor layer on a substrate, and etching the first conductive semiconductor layer, the active layer, and the second conductive semiconductor layer to expose a region of the substrate; forming a molding of a material including polyimide (PI), polycyclohexylenedimethylene terephthalate (PCT), or an epoxy molding compound (EMC) such that the molding covers the plurality of semiconductor light emitters and the exposed region of the substrate; forming a partition structure including the molding on each of the plurality of semiconductor light emitters by removing the substrate; and forming a wavelength converter in each groove defined by the partition structure.

The embodiments may be realized by providing a method of manufacturing a display panel, the method including preparing a first substrate structure such that the first substrate structure includes: a plurality of semiconductor light emitters having a first conductive semiconductor layer, an active layer, and a second conductive semiconductor layer on a first substrate, electrode pads connected to the first conductive semiconductor layer and the second conductive semiconductor layer, of the plurality of semiconductor light emitters, respectively, and a molding including a flexible material that covers the plurality of semiconductor light emitters; preparing a second substrate structure including a plurality of TFT cells on a second substrate, the plurality of TFT cells respectively corresponding to the plurality of semiconductor light emitters; bonding the first substrate structure to the second substrate structure at a process temperature, to connect the electrode pads of the first substrate structure to connectors of the second substrate structure, respectively; forming a plurality of grooves separated by the molding and overlying the plurality of semiconductor light emitters, respectively, by removing the first substrate; and forming a plurality of wavelength converters in each of the plurality of grooves, wherein the molding is formed of a material having a modulus lower than that of the semiconductor light emitters.

BRIEF DESCRIPTION OF DRAWINGS

Features will be apparent to those of skill in the art by describing in detail exemplary embodiments with reference to the attached drawings in which.

DETAILED DESCRIPTION

Figure 1:
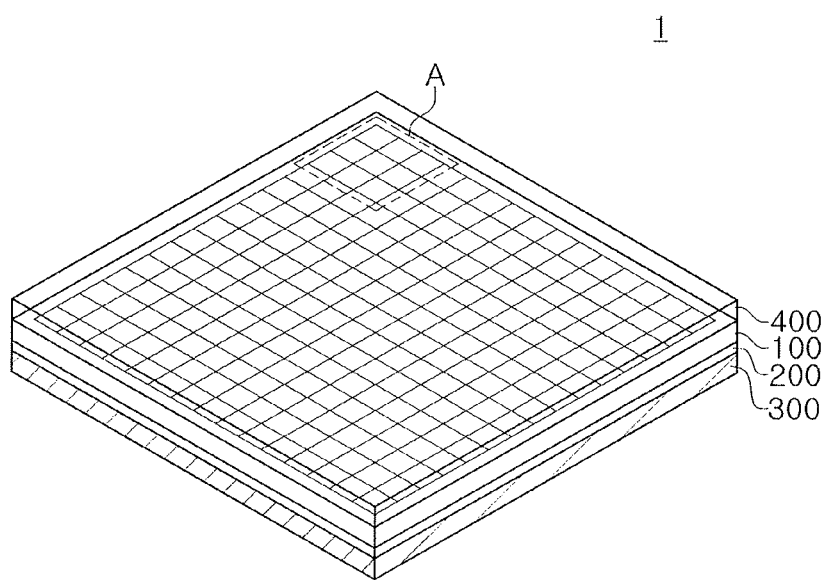
FIG. 1 illustrates a schematic perspective view of a display panel using a light emitting device package according to an example embodiment of the present disclosure.
Figure 2:
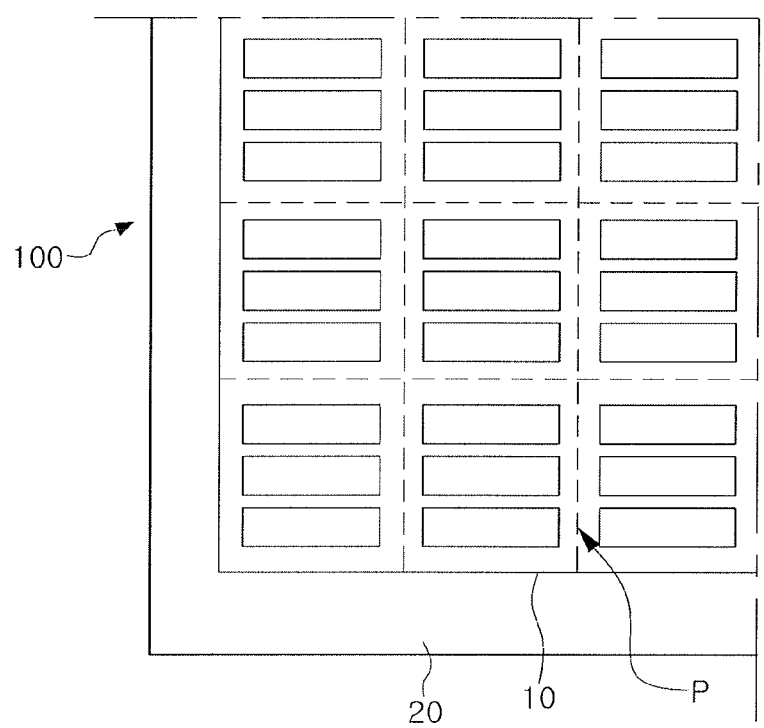
FIG. 2 illustrates a plan view of portion 'A' of FIG. 1.
Figure 3:
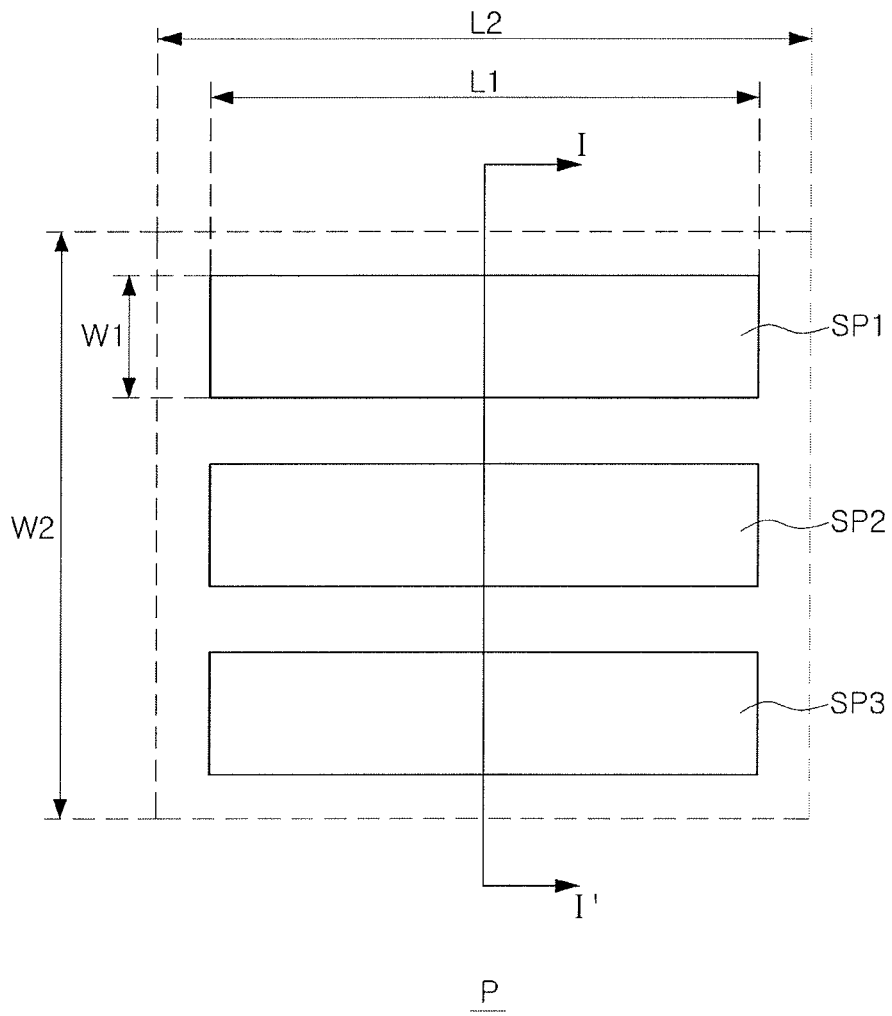
FIG. 3 illustrates an enlarged view of one pixel of FIG. 2.
Figure 4:
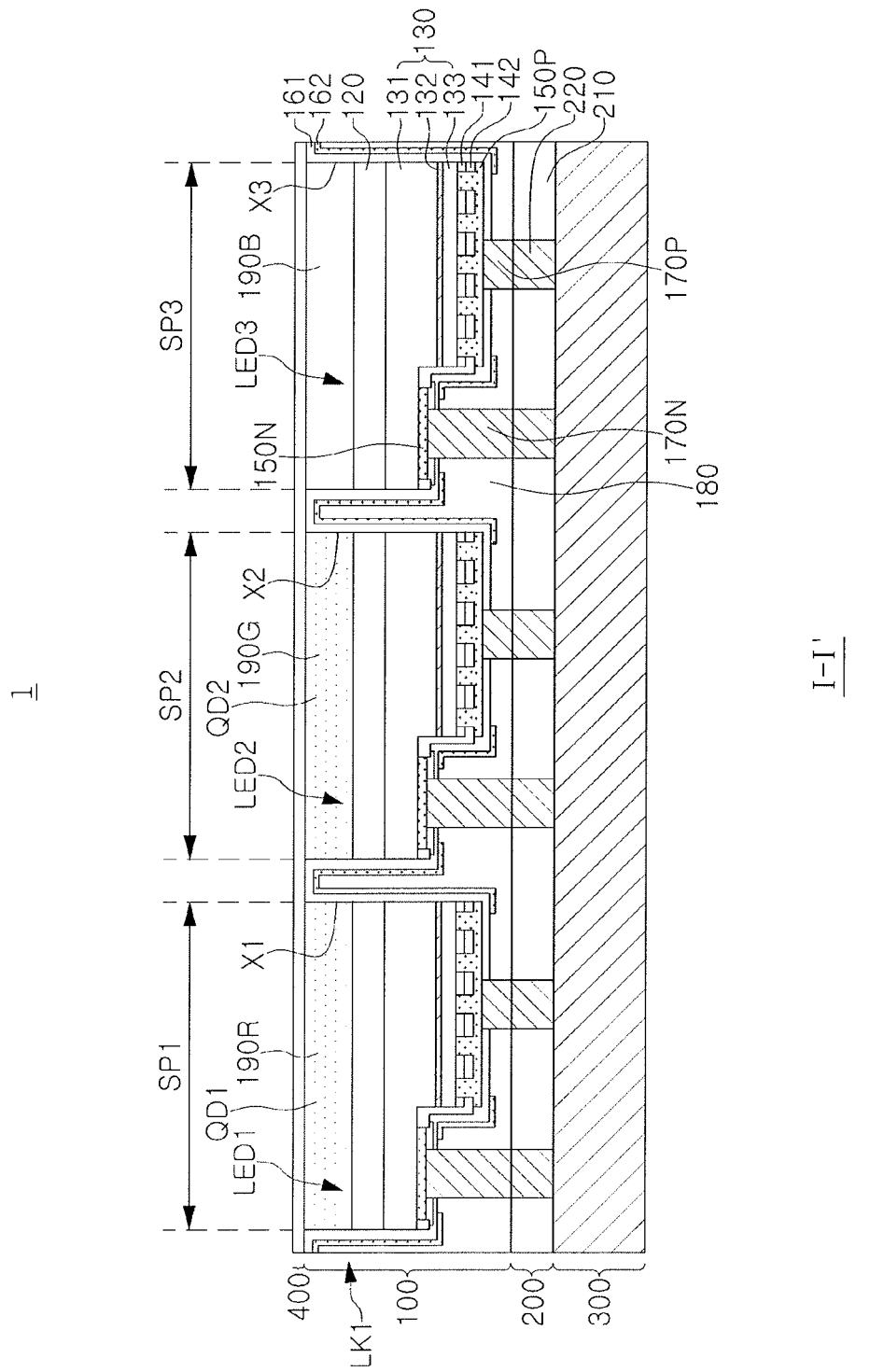
FIG. 4 illustrates a side cross-sectional view taken along line I-I' of FIG. 3.

FIG. 1 illustrates a schematic plan view of a display panel having a light emitting device package according to an example embodiment of the present disclosure, and FIG. 2 illustrates a plan view of portion 'A' of FIG. 1. FIG. 3 illustrates an enlarged view of one pixel of FIG. 2, and FIG. 4 illustrates a side cross-sectional view taken along line I-I' of FIG. 3.

Referring to FIG. 1, a display panel 1 according to an example embodiment of the present disclosure may include a first substrate structure 100 including a light emitting element array, and a second substrate structure 300 on a lower portion of the first substrate structure 100 and including a driving circuit. A protective layer 400 may be on an upper surface of the first substrate structure 100, and a bonding layer 200 may be between the first substrate structure 100 and the second substrate structure 300. The display panel 1 may have a rectangular shape or another suitable shape. The display panel 1 may have flexible characteristics. For example, the upper surface of the display panel 1 may have a profile having a curved surface in addition to a flat surface. In an implementation, the display panel 1 may be a display panel that is ultra compact and having a high-resolution, and which is used for a head set for virtual reality or augmented reality.

Referring to FIG. 2, the first substrate structure 100 may include a pixel region 10 and a molding region 20 surrounding the pixel region 10. In the pixel region 10, a plurality of pixels P may be arranged in a column and a row. In an implementation, as illustrated in the drawing figures, the plurality of pixels P may form an array in a rectangular form of 15×15. In an implementation, the number of columns and rows may be implemented as a suitable number (e.g., 1024×768, 1920×1080, 3840×2160, and 7680×4320), and the plurality of pixels may be arranged in various shapes other than a rectangle. The plurality of pixels P may be connected to each other. For example, the plurality of pixels P may not be separately manufactured, and the whole may be manufactured at the same operation at one time.

The molding region 20 may be around (e.g., may surround) the pixel region 10. The molding region 20 may include a (e.g., black) matrix. For example, the black matrix may be in a peripheral region of the first substrate structure 100 to serve as a guide line defining a region in which the plurality of pixels P are arranged. The matrix may not be black. In an implementation, a white matrix or a green matrix may be used as the matrix depending on intended purposes or uses of products, and a matrix formed of a transparent material may be used in place of the matrix if desired.

FIG. 3 illustrates one pixel P, and FIG. 4 illustrates a cross-sectional structure of the one pixel P. The first to third semiconductor light emitters LED1, LED2, and LED3 of FIG. 4 may be understood to correspond to first to third subpixels SP1, SP2, and SP3, respectively.

Referring to FIG. 3, each pixel P may include the first to third subpixels SP1, SP2, and SP3 configured to emit light having different colors. The first to third subpixels SP1, SP2, and SP3, included in each pixel P, may have a structure in which subpixels are adjacent to each other. The first to third subpixels SP1, SP2, and SP3 may be configured to provide different colors, so a color image may be represented by the display panel 1. For example, the first to third subpixels SP1, SP2, and SP3 may be subpixels emitting light having red (R), green (G), and blue (B) colors, respectively. In an implementation, various colors, e.g., Cyan, Yellow, Magenta, and Black (CYMK) may be used. In an implementation, one pixel P may include three subpixels corresponding to RGB, respectively. In an implementation, the pixel P may include four or more subpixels. In an implementation, three subpixels may be arranged side by side. Each of the first to third subpixels SP1, SP2, and SP3 may have a width (in a first direction) W1 of about 1 μm and a length (in a second direction perpendicular to the first direction) L1 of about 3 μm, and thus a width W2 and a length L2 of the pixel P may have a size allowing pixel density to be equal to or more than 8000 pixels per inch (PPI).

Referring to FIGS. 3 and 4, one pixel P may include a first substrate structure 100 and a second substrate structure 300, vertically stacked. The first substrate structure 100 and the second substrate structure 300 may be bonded by the bonding layer 200.

A protective layer 400 may be bonded to an upper portion of the first substrate structure 100 (e.g., to a side of the first substrate structure 100 facing away from the second substrate structure 300). The first substrate structure 100 and the second substrate structure 300 may be bonded to each other using a wafer bonding method such as fusion bonding at a wafer level to be integrated.

The first substrate structure 100 may include a light emitting device package LK1 including first to third semiconductor light emitters LED1, LED2, and LED3. The light emitting device package LK1 may include first and second electrode pads 170N and 170P connected to each of the first to third semiconductor light emitters LED1, LED2, and LED3, an insulating layer 161 covering the first to third semiconductor light emitters LED1, LED2, and LED3, a reflective layer 162 reflecting light emitted by the first to third semiconductor light emitters LED1, LED2, and LED3 while covering the insulating layer 161, first to third wavelength converters 190R, 190G, and 190B disposed on the first to third semiconductor light emitters LED1, LED2, and LED3, respectively, and a molding 180 separating the first to third wavelength converters 190R, 190G, and 190B from each other and encapsulating the first to third semiconductor light emitters LED1, LED2, and LED3. The first and second electrode pads 170N and 170P may be formed of a conductive material such as a metal.

The light emitting device package LK1 may include the first to third semiconductor light emitters LED1, LED2, and LED3, and each of the first to third semiconductor light emitters LED1, LED2, and LED3 may include a semiconductor laminate 130 in which epitaxial layers such as a first conductive semiconductor layer 131, an active layer 132, and a second conductive semiconductor layer 133 are stacked. A buffer layer 120 for mitigating a difference in lattice constant between an epitaxial layer and a substrate may be on the first conductive semiconductor layer 131. The epitaxial layers may be grown using the same operation on one wafer. For example, active layers 132 of the first to third semiconductor light emitters LED1, LED2, and LED3 may emit the same light. In an implementation, the active layer 132 may emit blue light (e.g., 440 nm to 460 nm). The first to third semiconductor light emitters LED1, LED2, and LED3 may have the same structure. An insulating layer 142 may be on a lower surface of the second conductive semiconductor layer 133, and an ITO layer 141 (for improving contact properties of the second conductive semiconductor layer 133) may be between the insulating layer 142 and the second conductive semiconductor layer 133.

The first conductive semiconductor layer 131 and the second conductive semiconductor layer 133 may be an n-type semiconductor layer and a p-type semiconductor layer, respectively. In an implementation, the semiconductor layer may be a nitride semiconductor of $Al_xIn_yGa_{(1-x-y)}N$ (in which $0 \leq 1$, $0 \leq y \leq 1$, and $0 \leq y+y \leq 1$). The active layer 132 may have a multiple quantum well (MQW) structure in which quantum well layers and quantum barrier layers are alternately stacked on each other. In an implementation, the active layer 122 may be a nitride-based MQW such as InGaN/GaN or GaN/AlGaN. In an implementation, the active layer may be another semiconductor, e.g., GaAs/AlGaAs, InGaP/GaP, or GaP/AlGaP. As used herein, the term "or" is not an exclusive term, e.g., "A or B" would include A, B, or A and B.

An insulating layer 161 may be included in a lower portion of the light emitting device package LK1, and the insulating layer 161 may surround each of the first to third semiconductor light emitters LED1, LED2, and LED3 to allow the first to third semiconductor light emitters LED1, LED2, and LED3 to be electrically separated from each other. The insulating layer 161 may extend to cover side surfaces of the first to third wavelength converters 190R, 190G, and 190B. The insulating layer 161 may be formed of a material having electrically insulating properties. In an implementation, the insulating layer 161 may be a silicon oxide, a silicon oxynitride, or a silicon nitride. In an implementation, a reflective layer 162, formed of a highly reflective material, may be on the insulating layer 161. In an implementation, the reflective layer 162 may be framed of aluminum (Al). The insulating layer 161 and the reflective layer 162 may help block optical interference among the first to third semiconductor light emitters LED1, LED2, and LED3.

Each of the first to third semiconductor light emitters LED1, LED2, and LED3 may include the first and second electrodes 150N and 150P, applying power to the first conductive semiconductor layer 131 and the second conductive semiconductor layer 133, respectively. The first and second electrodes 150N and 150P may be in a mesa-etched region of the first conductive semiconductor layer 131 and the second conductive semiconductor layer 133, respectively. In an implementation, the first electrode 150N may include, e.g., Al, Au, Cr, Ni, Ti, or Sn, and the second electrode 150P may be formed of a reflective metal. In an implementation, the second electrode 150P may include, e.g., Ag, Ni, Al, Cr, Rh, Pd, Ir, Ru, Mg, Zn, Pt, or Au, and may be employed as a structure having a single layer or two or more layers.

Each of the first to third semiconductor light emitters LED1, LED2, and LED3 may include first and second electrode pads 170N and 170P for applying power. The first and second electrode pads 170N and 170P may be connected to the first and second electrodes 150N and 150P, respectively.

The first substrate structure 100 may include the molding 180 exposing the first and second electrode pads 170N and 170P while packing a lower surface of the light emitting device package LK1. For example, the molding 180 may have a partition wall protruding between the first to third semiconductor light emitters LED1, LED2, and LED3 to allow the first to third wavelength converters 190R, 190G, and 190B to be separated from each other.

The molding 180 may be formed of a material having a low modulus, allowing the first substrate structure 100 to have flexible characteristics. For example, the molding 180 may be formed of a material having a modulus lower than that of the semiconductor laminate 130 and having high tensile properties. In an implementation, the molding 180 may include, e.g., polyimide (PI), polycyclohexylenedimethylene terephthalate (PCT), or an epoxy molding compound (EMC). In an implementation, the molding 180 may include light reflecting particles for reflecting light. In an implementation, the light reflecting particles may include, e.g., a titanium dioxide ($TiO_2$) or an aluminum oxide ($Al_2O_3$).

The molding 180 may have or form a partition wall surrounding side surfaces of the first to third wavelength converters 190R, 190G, and 190B, in order to separate the first to third wavelength converters 190R, 190G, and 190B from each other. A side wall of the molding 180 may protrude, e.g., upwardly, at each of the first to third semiconductor light emitters LED1, LED2, and LED3, to form first to third light emitting windows X1, X2, and X3, filling the first to third wavelength converters 190R, 190G, and 190B, respectively. The first to third wavelength converters 190R, 190G, and 190B may respectively be in the first to third light emitting windows X1, X2, and X3. For example, light, emitted by the first to third semiconductor light emitters LED1, LED2, and LED3, may not be subjected to optical interference, and may be emitted through the first to third wavelength converters 190R, 190G, and 190B.

For example, a wavelength conversion material (e.g., a quantum dot (QD)) may be filled in the first to third light emitting windows X1, X2, and X3 of the molding 180, and may be dispersed in a liquid binder resin, and may then be cured to form the first to third wavelength converters 190R, 190G, and 190B. In an implementation, at least one among the first to third wavelength converters 190R, 190G, and 190B may only include a binder resin without a wavelength conversion material. In an implementation, the first and second wavelength converters 190R and 190G include quantum dots QD1 and QD2, for wavelength conversion of blue light into red light and green light, and the third wavelength converter 190B may only include a binder resin without a separate quantum dot.

A liquid photosensitive resin composition in which the red quantum dot QD1 and the green quantum dot QD2 are dispersed in a binder resin may be filled in the first and second light emitting windows X1 and X2, and then cured to form the first and second wavelength converters 190R and 190G. A liquid photosensitive resin composition from which a quantum dot is excluded is filled in the third light emitting windows X3, and then cured to form the third wavelength converter 190B. The binder resin may be formed of a material including an acrylic based polymer.

A protective layer 400 (e.g., which may help prevent deterioration of the first to third wavelength converters 190R, 190G, and 190B) may be on an upper portion of the first to third wavelength converters 190R, 190G, and 190B.

A bonding layer 200 be bonded to the second substrate structure 300 may be on a lower portion of the first substrate structure 100 (e.g., between the first substrate structure 100 and the second substrate structure 300). The bonding layer 200 may include an insulating bonding layer 210 and a conductive bonding layer 220.

The insulating bonding layer 210 may facilitate bonding of the first substrate structure 100 to the second substrate structure 300. The insulating bonding layer 210 may be formed of a material having a composition the same as the molding 180 of the first substrate structure 100. The conductive bonding layer 220 may facilitate bonding of the first and second electrode pads 170N and 170P of the first substrate structure 100 to the second substrate structure 300, and may be formed of a conductive material having a composition the same as the first and second electrode pads 170N and 170P. For example, the first substrate structure 100 and the second substrate structure 300 may be bonded to each other through the bonding layer 200 and may be integrated.

The second substrate structure 300 may include a driving circuit including a plurality of TFT cells for controlling the light emitting device package LK1 of the first substrate structure 100. The plurality of TFT cells may form TFT circuitry for controlling driving of the plurality of pixels P.

The plurality of TFT cells may be connected to the first to third semiconductor light emitters LED1, LED2, and LED3, respectively, through the conductive bonding layer 220 of the bonding layer 200. The plurality of TFT cells may include a semiconductor layer formed by injecting impurities into a semiconductor substrate. For example, a semiconductor layer forming the plurality of TFT cells may include a polysilicon semiconductor or a silicon semiconductor, a semiconductor oxide such as indium gallium zinc oxide, or a compound semiconductor such as silicon germanium.

Figure 5:
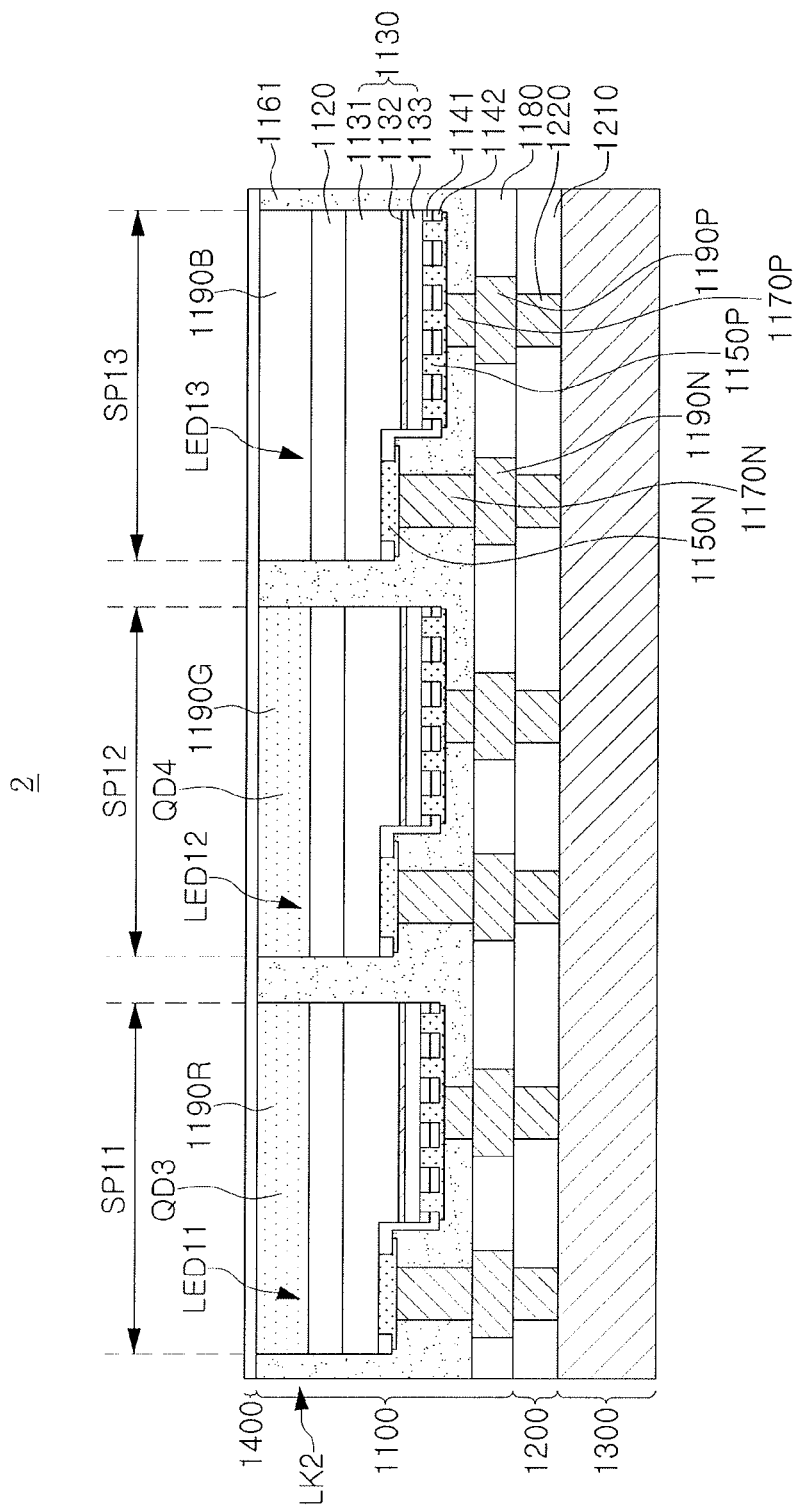
FIG. 5 illustrates a cross-sectional view of a display panel according to an example embodiment of the present disclosure.

FIG. 5 illustrates a cross-sectional view of a display panel having a light emitting device package according to an example embodiment of the present disclosure.

Referring to FIG. 5, a display panel 2 according to an example embodiment of the present disclosure may include first to third subpixels SP11, SP12, and SP13. The display panel 2 may include a first substrate structure 1100 and a second substrate structure 1300. The first substrate structure 1100 and the second substrate structure 1300 may be bonded by a bonding layer 1200. A protective layer 1400 may be on an upper surface of the first substrate structure 1100. The first substrate structure 1100 may include a light emitting device package LK2 including first to third semiconductor light emitters LED11, LED12, and LED13. The light emitting device package LK2 may include first and second electrode pads 1170N and 1170P, first to third wavelength converters 1190R, 1190G, and 1190B, a first molding 1161 and a second molding 1180. Each of the first to third semiconductor light emitters LED11, LED12, and LED13 may include a semiconductor laminate 1130 in which epitaxial layers such as a first conductive semiconductor layer 1131, an active layer 1132, and a second conductive semiconductor layer 1133 are stacked. A buffer layer 1120 may be on the first conductive semiconductor layer 1131. An insulating layer 1142 may be on a lower surface of the second conductive semiconductor layer 1133, and an ITO layer 1141 may be between the insulating layer 1142 and the second conductive semiconductor layer 1133. The bonding layer 1200 may include an insulating bonding layer 1210 and a conductive bonding layer 1220. Third and fourth electrode pads 1190N and 1190P may be connected to the first and second electrode pads 1170N and 1170P, respectively. The second molding 1180 may have surrounding side surfaces of the third and fourth electrode pads 1190N and 1190P.

When comparing the display panel 2 of FIG. 5 with the display panel 1 according to the example embodiment described previously, there is a difference in that a molding may include the first molding 1161 and the second molding 1180, and there is a difference in that a reflective layer and an insulating layer for insulating the reflective layer from each of the first to third semiconductor light emitters LED1, LED2, and LED3 according to an example embodiment described previously are removed.

In an implementation, the first molding 1161 may be formed of, e.g., polycyclohexylenedimethylene terephthalate (PCT) and a white epoxy molding compound (a white EMC) having high reflectivity. For example, even if an additional reflective layer were to be omitted, a sufficient light reflection effect may be expected only by the first molding 1161. The material described above has a melting point equal to or less than 230° C., so the first molding 1161 could be melted in a bonding process performed at a temperature equal to or more than 350° C. For example, if the first molding 1161 were to be melted, an appearance thereof could be deformed, and a function as a molding may be lost. In an implementation, on a lower portion of the first molding 1161 (e.g., proximate to the second substrate structure 1300), a material layer such as polyimide (PI) (e.g., a material that would not be melted in a bonding process) may be added or included as a second molding 1180. For example, even if the first molding 1161 were to be melted in a bonding process, an appearance thereof may be maintained, so a function as a molding may be also maintained.

Figure 6:
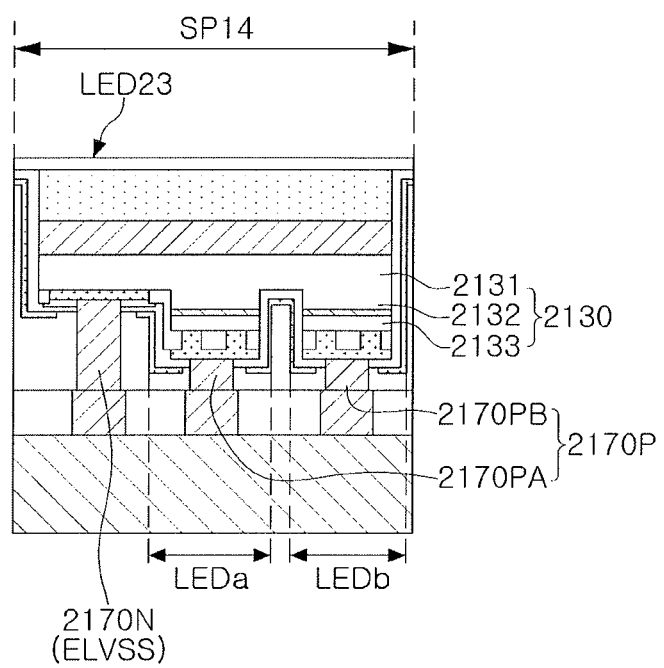
FIG. 6 illustrates a partial cross-sectional view of a light emitting device package according to an example embodiment of the present disclosure.

FIG. 6 illustrates a modification of the light emitting device package, described previously, and a light emitting device package of FIG. 6 may be a structure in which a semiconductor laminate 2130, in which epitaxial layers such as a first conductive semiconductor layer 2131, an active layer 2132, and a second conductive semiconductor layer 2133 are stacked, is included, and a single first electrode pad 2170N is connected to a first conductive semiconductor layer 2131. The light emitting device package of FIG. 6 may be modified so that the semiconductor laminate 2130, included in a single semiconductor light emitter LED23, has first and second regions LEDa and LEDb, sharing a first conductive semiconductor layer 2131. Correspondingly, a second electrode pad 2170P may also be divided into two second electrode pads 2170PA and 2170PB. For example, the semiconductor light emitter LED23 having the first and second regions LEDa and LEDb, to be driven independently, may be in a single subpixel S14. As described above, the semiconductor light emitter LED23 having the first and second regions LEDa and LEDb may selectively supply power to the first and second regions LEDa and LEDb, using a driving circuit to be described later. For example, if a problem were to occur in one of the first and second regions LEDa and LEDb and the one is not normally operated, automatically switching to the other region may be performed. For example, the lifetime of a light emitting device package could be extended. If a problem were to occur in a portion of a driving circuit, for controlling one of the first and second regions LEDa and LEDb, automatically switching to a driving circuit, for controlling the other region, may be performed. For example, the lifetime of a light emitting device package could be extended.

Figure 7:
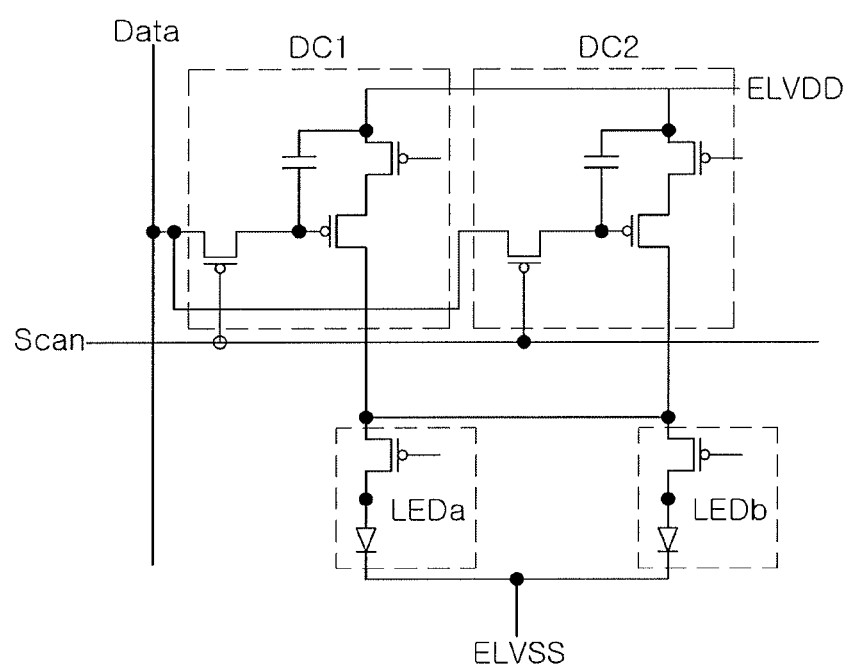
FIG. 7 illustrates a driving circuit diagram of a display panel using a light emitting device package according to an example embodiment of the present disclosure.

FIG. 7 illustrates a driving circuit of the light emitting device package of FIG. 6. Two regions LEDa and LEDb, forming a single subpixel, may be driven by separate driving circuits DC1 and DC2, respectively. Each of the two regions LEDa and LEDb may receive a data signal through a data line, and may be on/off controlled through a scan line. The driving circuit described above may be implemented using an integrated circuit and/or a thin film transistor circuit.

Hereinafter, a process of manufacturing a display panel according to an example embodiment will be described. FIGS. 8 to 16 illustrate schematic views of stages in a method of manufacturing the display panel of FIG. 4.

Figure 8:
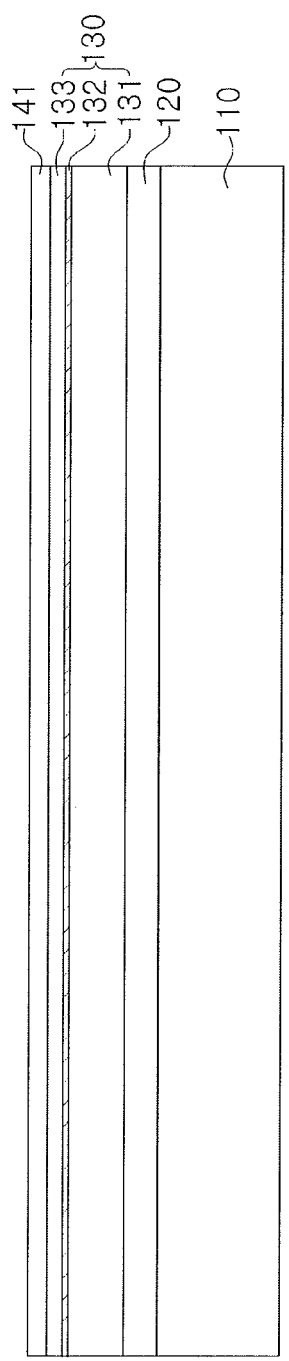
FIGS. 8 to 16 illustrate schematic views of stages in a method of manufacturing the display panel of FIG. 4.

First, referring to FIG. 8, a buffer layer 120 may be formed on a substrate 110, and a semiconductor laminate 130 may be formed on a buffer layer 120. The substrate 110 may include, e.g., sapphire, Si, SiC, MgAl2O4, MgO, LiAlO2, LiGaO2, GaN, or the like. In an implementation, the substrate 110 may be doped with boron at a concentration equal to or more than $10^{19}$ atoms/cm³, in order to help secure etching selectivity in a subsequent process. The semiconductor laminate 130 may be formed by sequentially growing the first conductive semiconductor layer 131, the active layer 132, and the second conductive semiconductor layer 133 on the substrate 110 using a process such as metal organic chemical vapor deposition (MOCVD), hydride vapor phase epitaxy (HVPE), or a molecular beam epitaxy (MBE). The first conductive semiconductor layer 131 and the second conductive semiconductor layer 133 may be an n-type semiconductor layer and a p-type semiconductor layer, respectively. An ITO layer 141 (for improving contact characteristics of the second conductive semiconductor layer 133) may be formed on the semiconductor laminate 130.

Figure 9:
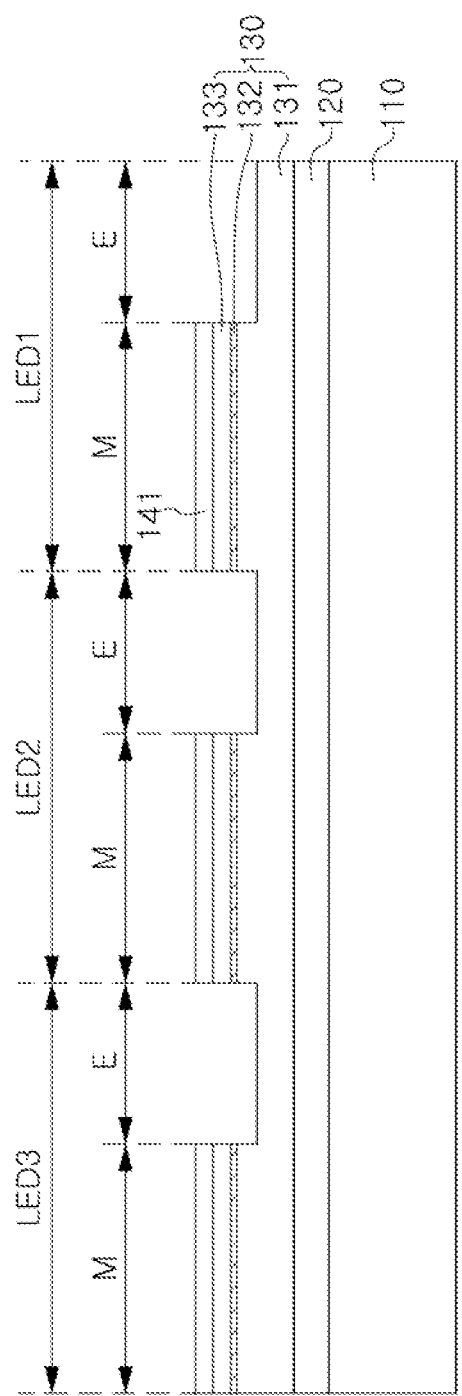

Referring to FIG. 9, in order to expose at least a portion of the first conductive semiconductor layer 131, a partial region E of the semiconductor laminate 130 may be etched to form a mesa region M.

Figure 10:
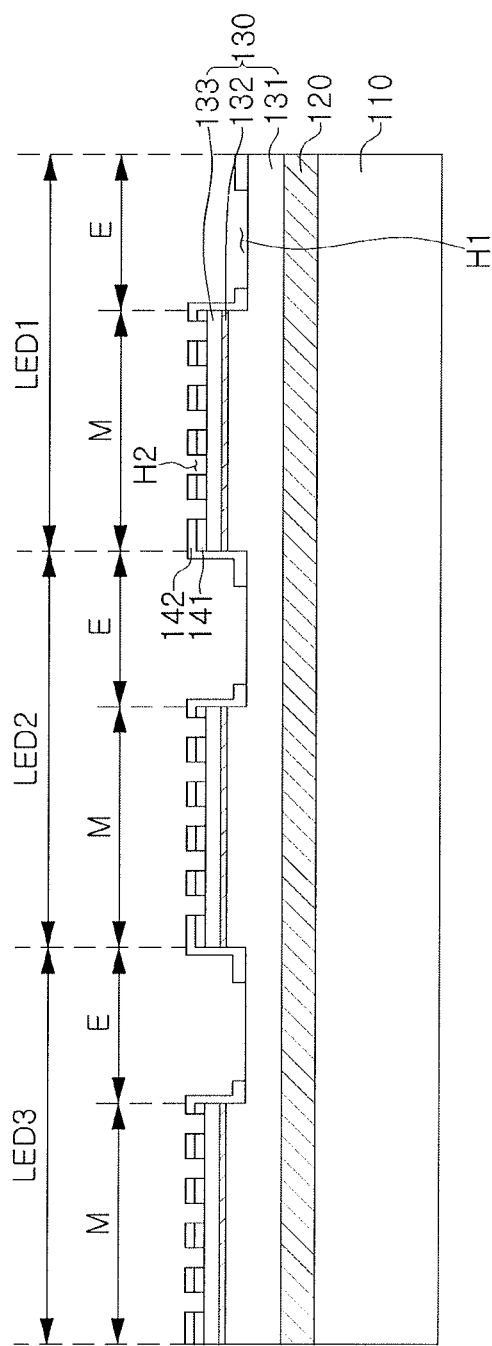
Figure 11:
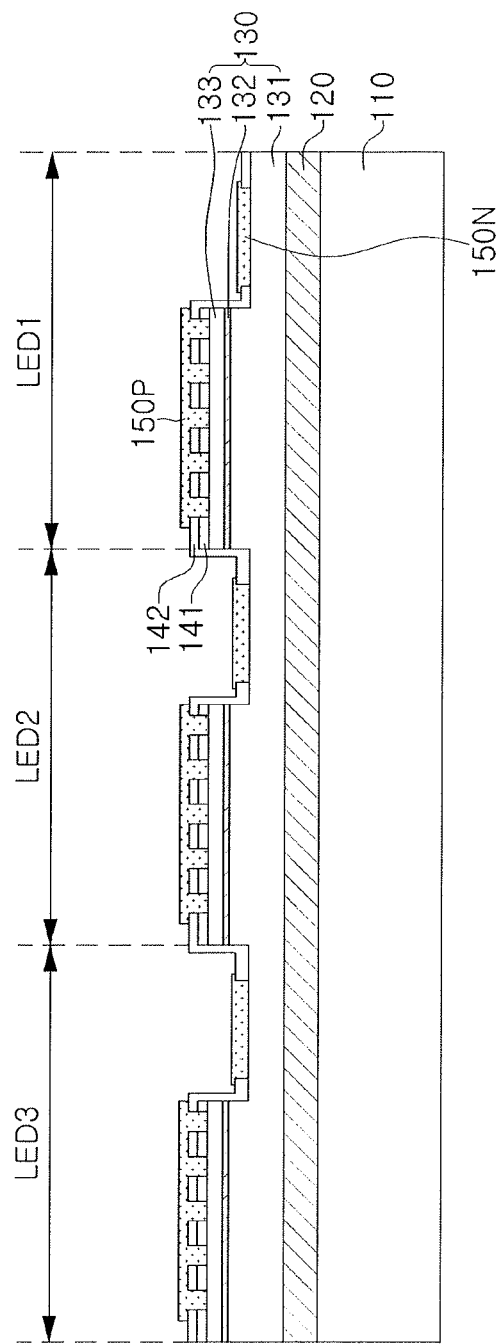

Referring to FIGS. 10 and 11, an insulating layer 142 covering an upper surface of the semiconductor laminate 130 may be formed, a partial region thereof may be removed to form contact holes H1 and H2 exposing the first conductive semiconductor layer 131 and the second conductive semiconductor layer 133, and first and second electrodes 150N and 150P may be formed in the contact holes H1 and H2.

Figure 12:
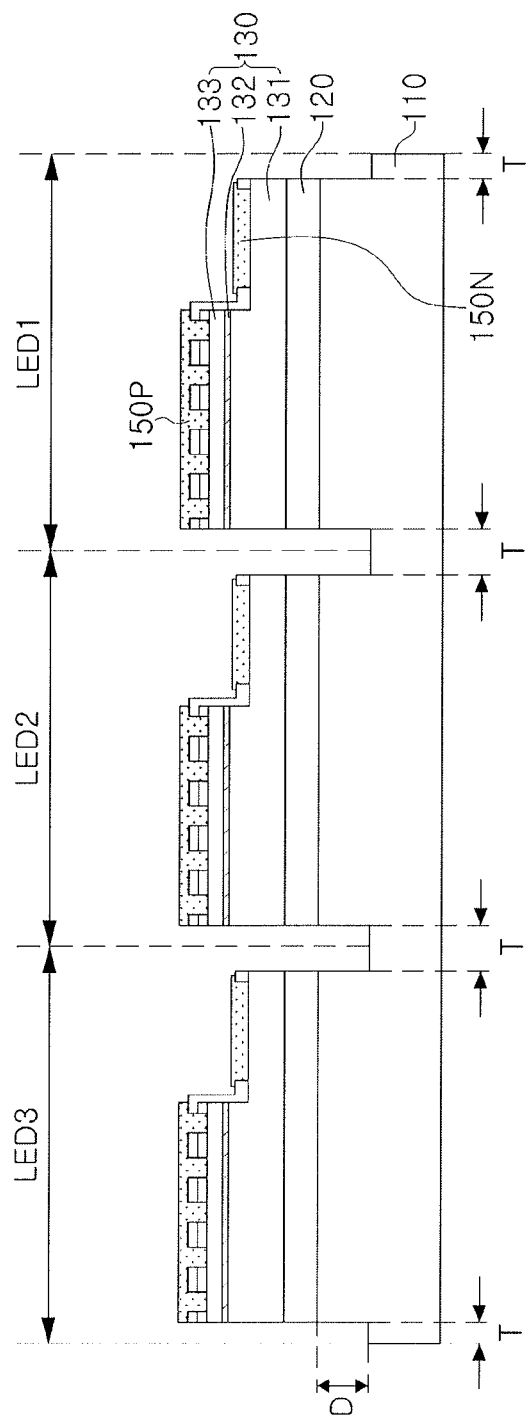

Referring to FIG. 12, a trench T separating the semiconductor laminate 130 into the first to third semiconductor light emitters LED1, LED2, and LED3 may be provided. The trench T may etch not only the semiconductor laminate 130 but also a partial region of the substrate 110 to a predetermined depth D. In the trench T, a partition wall structure in which a molding is filled to separate a wavelength converter may be formed in a subsequent process.

Figure 13:
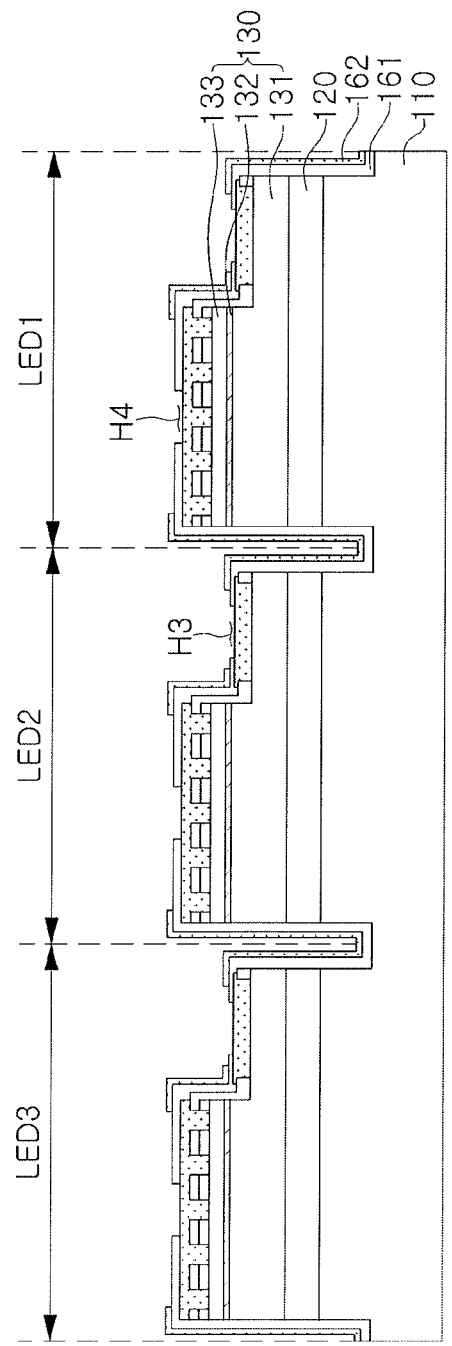

Referring to FIG. 13, an insulating layer 161 covering the first to third semiconductor light emitters LED1, LED2, and LED3 and a reflective layer 162 covering the insulating layer 161 may be formed.

Figure 14:
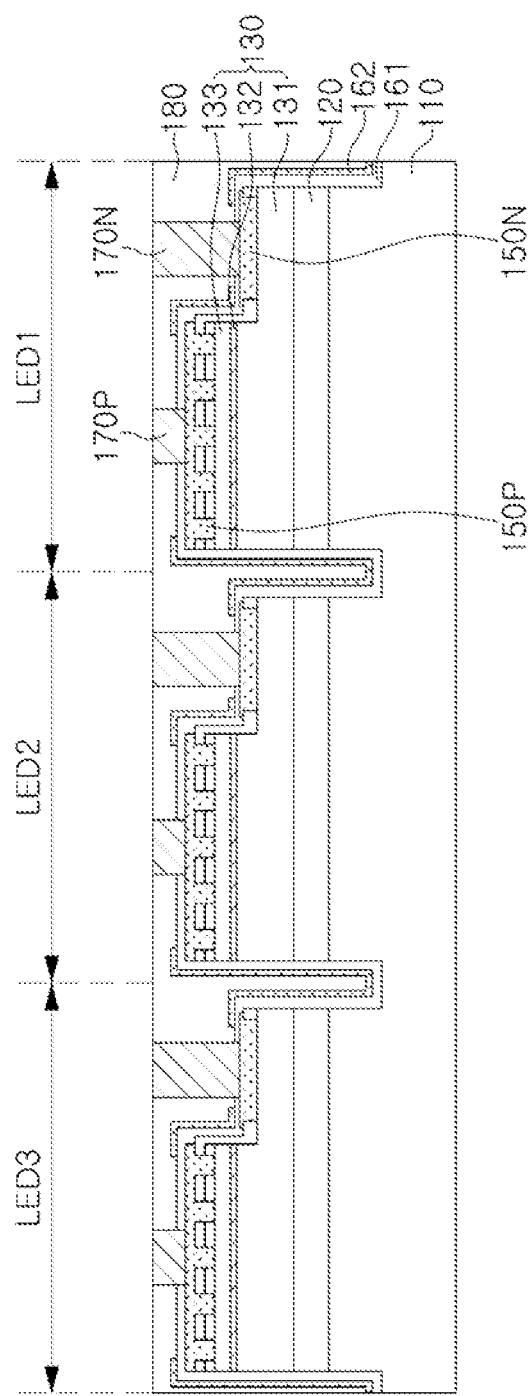

Referring to FIG. 14, a plating layer may be formed on the first and second electrodes 150N and 150P to form first and second electrode pads 170N and 170P, and a molding 180 covering side surfaces of the first and second electrode pads 170N and 170P may be formed. The molding 180 may fill the trench T to isolate the first to third semiconductor light emitters LED1, LED2, and LED3 from each other. The molding 180 may be formed of a material having a low modulus to have flexible characteristics. In an implementation, the molding 180 may be formed of a material having a modulus lower than that of the semiconductor laminate 130 and having high tensile properties. In an implementation, the molding 180 may include, e.g., polyimide (PI), polycyclohexylenedimethylene terephthalate (PCT), or an epoxy molding compound (EMC).

Figure 15:
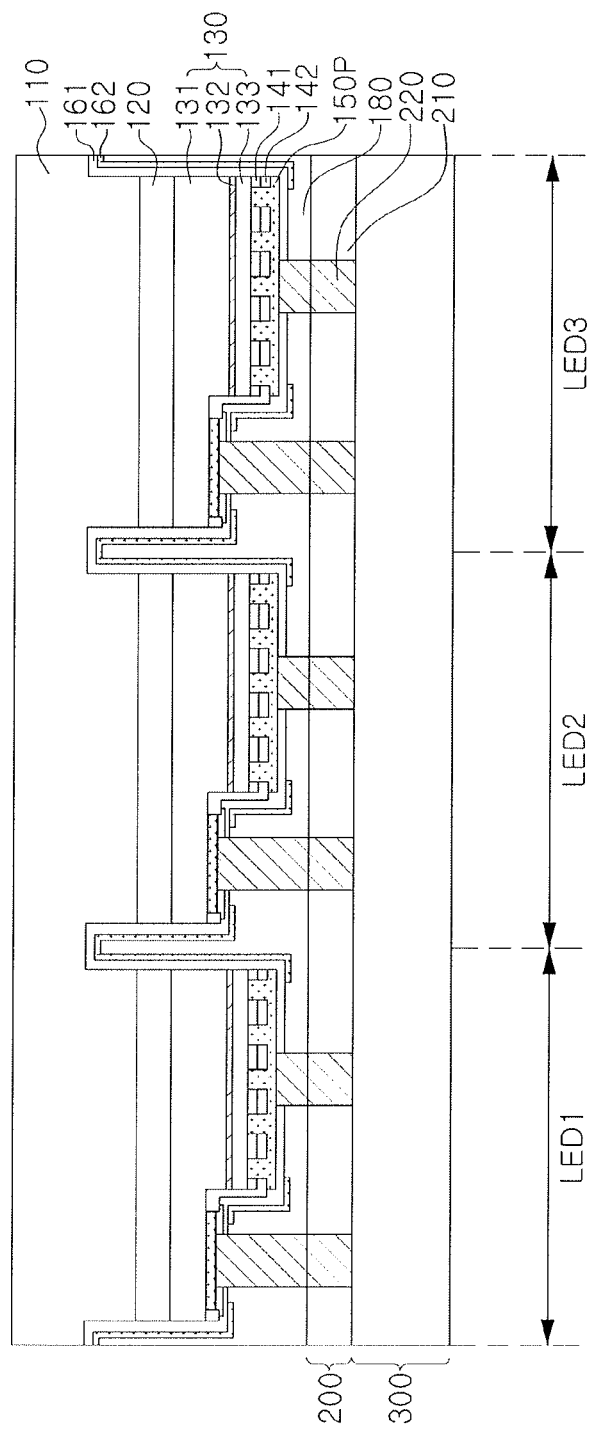

Referring to FIG. 15, a second substrate structure 300 may be attached to a lower portion of the molding 180 with a bonding layer 200 therebetween. The second substrate structure 300 may include a driving circuit including the plurality of TFT cells for controlling the first to third semiconductor light emitters LED1, LED2, and LED3. The plurality of TFT cells may include a semiconductor layer formed by injecting impurities into a semiconductor substrate. For example, a semiconductor layer forming the plurality of TFT cells may include a polysilicon semiconductor or silicon semiconductor, a semiconductor oxide such as indium gallium zinc oxide, or a compound semiconductor such as silicon germanium. The semiconductor substrate may be doped with boron at a concentration of equal to or less than $10^{16}$ atoms/cm$^3$, e.g., a concentration lower than a doping concentration on the substrate 110, in order to help secure etch selectivity in a subsequent process of separating the substrate for growth 110.

Figure 16:
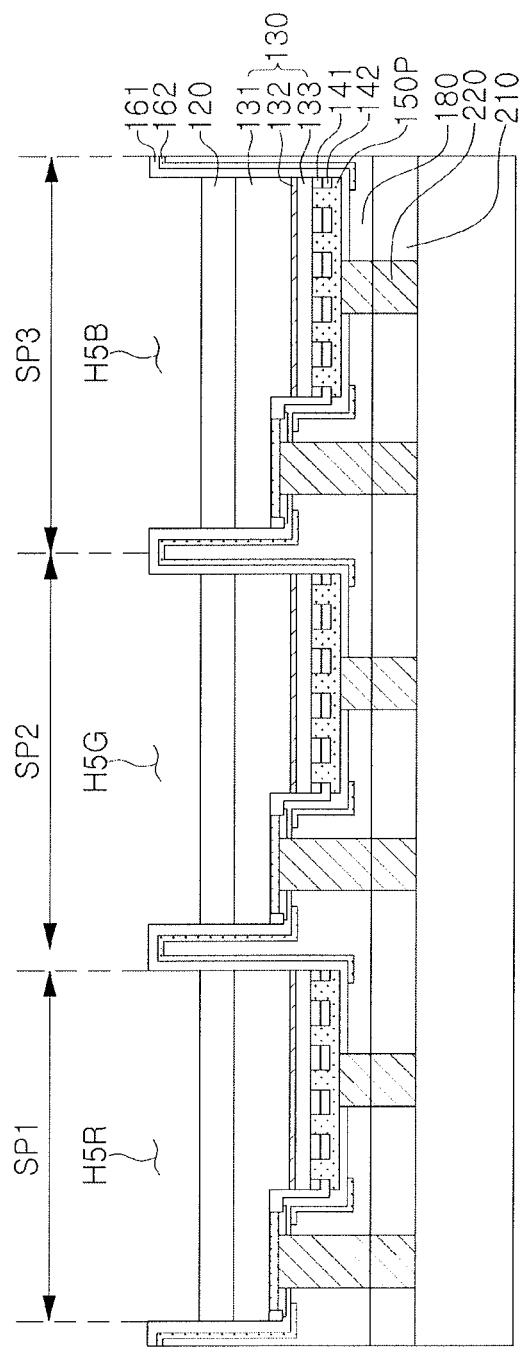

Referring to FIG. 16, the substrate 110 may be separated from the first to third semiconductor light emitters LED1, LED2, and LED3, and grooves H5R, H5G, and H5B, defined by a partition wall structure when viewed from the top, may be provided. Subsequently, a wavelength conversion material, e.g., a quantum dot (QD), filled in the grooves H5R, H5G, and H5B while being dispersed in a liquid binder resin to form first to third wavelength converters 190R, 190G, and 190B, and a protective layer 400 may be attached to an upper portion to manufacture the display panel 1 of FIG. 4.

Figure 17:
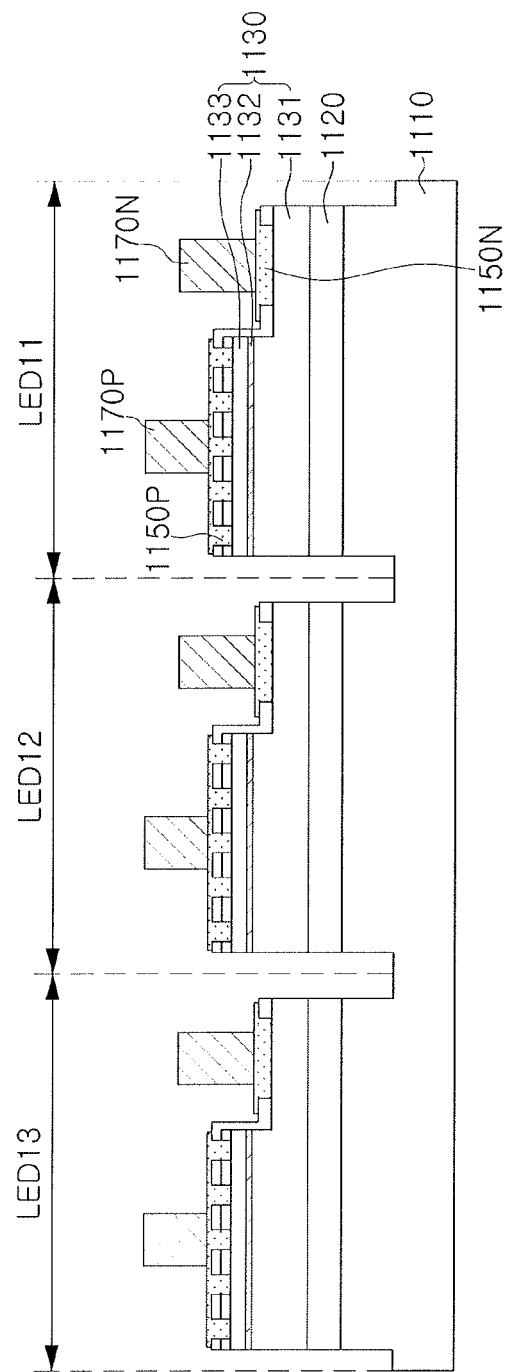
FIGS. 17 to 21 illustrate schematic views of stages in a method of manufacturing the display panel of FIG. 5.

A process of manufacturing a display panel according to an example embodiment will be described. FIGS. 17 to 21 illustrate schematic views of stages in a method of manufacturing the display panel of FIG. 5. Processes before than FIG. 17 are the same as the processes until FIG. 12 of the example embodiment described previously, repeated descriptions of the processes may be omitted.

Referring to FIG. 17, a plating layer is formed on the first and second electrodes 1150N and 1150P to form first and second electrode pads 1170N and 1170P.

Figure 18:
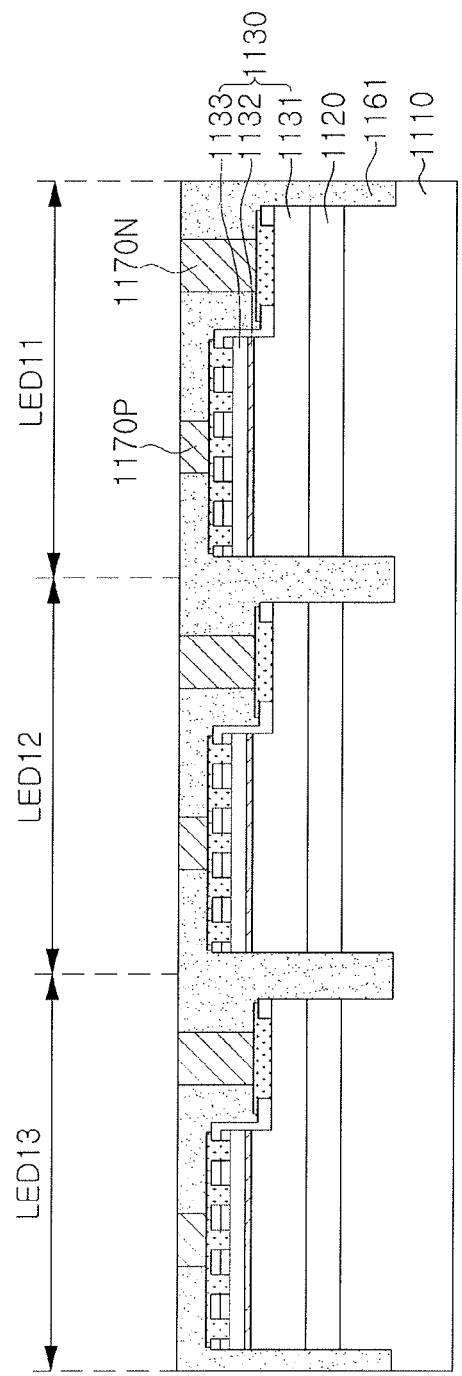

Referring to FIG. 18, a first molding 1161 (covering side surfaces of the first and second electrode pads 1170N and 1170P) may be formed. The first molding 1161 may fill the trench T to isolate the first to third semiconductor light emitters LED11, LED12, and LED13 from each other. The first molding 1161 may be formed of a material having a low modulus to have flexible characteristics, and may be formed of a material having a modulus lower than that of the semiconductor laminate 1130 and having high tensile properties. In an implementation, the first molding 1161 may be formed of, e.g., PCT or a white EMC. The PCT and white EMC have excellent reflectivity, as compared with PI, e.g., a material to be employed as a molding in the example embodiment described above. For example, forming a separate reflective layer for reflecting light emitted from the first to third semiconductor light emitters LED11, LED12, and LED13 may be omitted.

Figure 19:
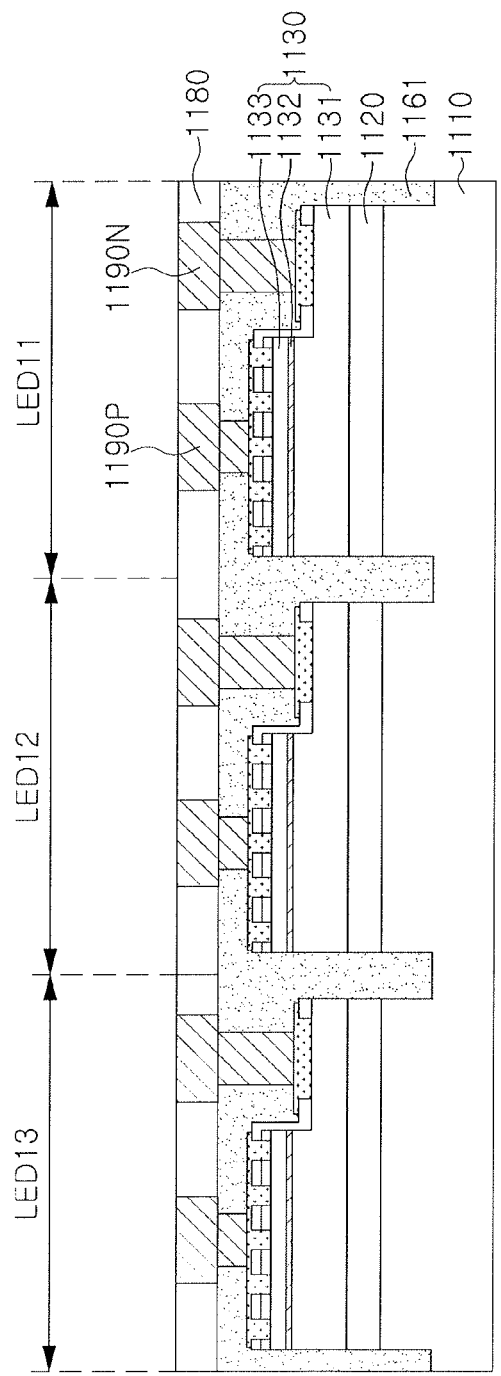

Referring to FIG. 19, a second molding 1180 (formed of a material including PI) may be formed on the first molding 1161. A melting point of the first molding 1161 (e.g., formed of a material including PCT or white EMC) may be equal to or less than 230° C., and the first molding could be melted in a subsequent process in which bonding is performed at a temperature equal to or more than 350° C., so a function as a molding could be lost. For example, the second molding 1180 (formed of PI having a higher melting point than the PCT or white EMC), may be formed on the first molding 1161, (formed of the PCT and white EMC). In this case, even if the first molding 1161 were to be melted due to heat of the bonding process, an appearance may be maintained due to the second molding 1180.

Figure 20:
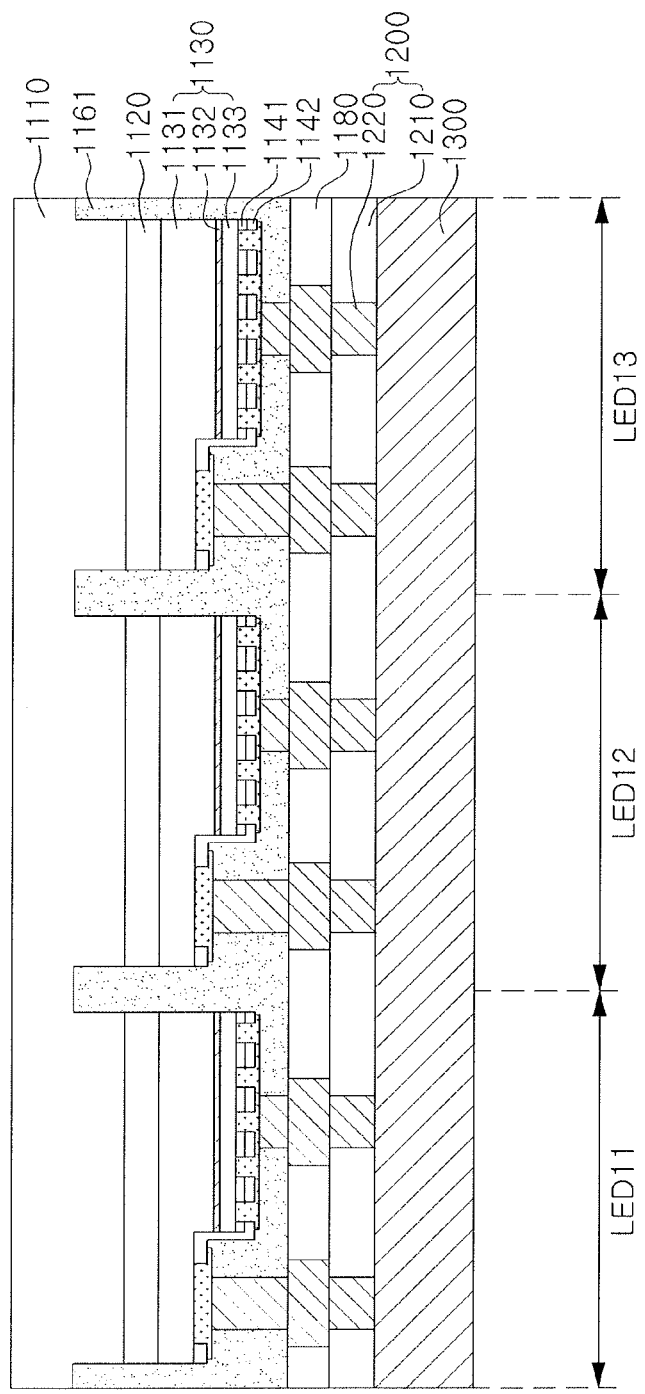

Referring to FIG. 20, the second substrate structure 1300 may be attached to a lower portion of the second molding 1180 with a bonding layer 1200 therebetween. The second substrate structure 1300 may include a driving circuit including the plurality of TFT cells for controlling the first to third semiconductor light emitters LED11, LED12, and LED13.

Figure 21:
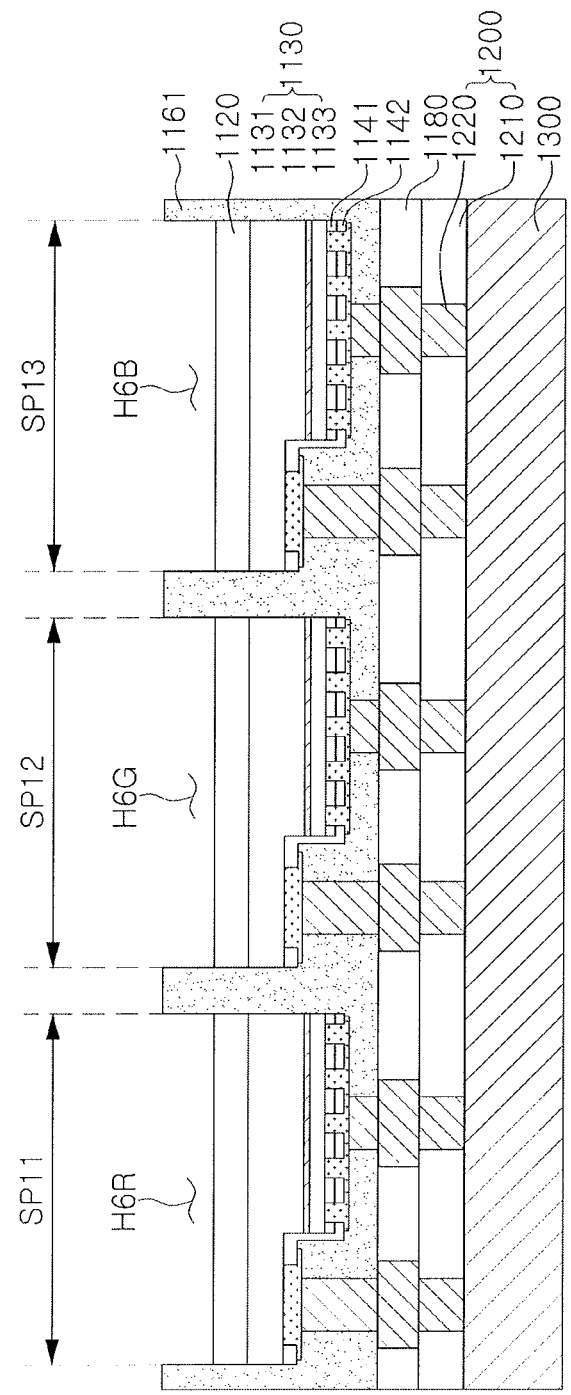

Referring to FIG. 21, the substrate 1110 may be separated from the first to third semiconductor light emitters LED11, LED12, and LED13, and grooves H6R, H6G, and H6B (e.g., defined by a partition wall structure when viewed from the top), may be provided. Subsequently, a wavelength conversion material, e.g., a quantum dot (QD), may be filled in the grooves H6R, H6G, and H6B while being dispersed in a liquid binder resin to form wavelength converters 1190R, 1190G, and 1190B, and a protective layer 1400 may be attached to an upper portion to manufacture the display panel 2 of FIG. 5.

By way of summation and review, some display panels may include liquid crystal display (LCD) panels, as well as backlight units; and display devices which do not require additional backlights through using an LED device as a single pixel have been under development. Such display panels may be compact and may be implemented as high brightness displays with improved optical efficiency, as compared to LCDs. Display panels may also allow an aspect ratio of a display image to be freely changed, and may be implemented as large display panels, thereby providing various forms of large displays. However, a partition wall structure therein may limit a resolution that As set forth above, according to example embodiments, by using a method of manufacturing a light emitting device package and a method of manufacturing a display panel using the same, may have an increased pixel density, may be flexible, may reduce a manufacturing, and may reduce a size of a light emitting device package and a display panel.

For example, one or more embodiments may provide a method of manufacturing a light emitting device package and a method of manufacturing a display panel, with which manufacturing costs may be reduced and miniaturization may be facilitated.

One or more embodiments may provide display panel or a method of manufacturing a display panel having flexibility and having an increased pixel density.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a light emitting device package, the method comprising:
   providing a substrate having a first surface and a second surface opposite to the first surface;
   forming a semiconductor laminate on the first surface of the substrate such that the semiconductor laminate has a first conductive semiconductor layer, an active layer, and a second conductive semiconductor layer,
   sequentially forming an indium tin oxide (ITO) layer and an insulating layer on the second conductive semiconductor layer;
   separating the semiconductor laminate into a plurality of semiconductor light emitters, separated from each other, by forming a trench having a predetermined depth in the substrate by etching through the semiconductor laminate in a direction from the first surface of the substrate to the second surface of the substrate;
   forming a molding that fills the trench and insulates the plurality of semiconductor light emitters from each other by applying an insulating material to cover the plurality of semiconductor light emitters, wherein forming the molding comprises
   forming a first molding filling the trench, and
   forming a second molding covering the first molding, wherein the second molding is formed of a material having a second melting point higher than a first melting point of the first molding;
   forming a plurality of grooves separated from each other by the molding and overlying to the plurality of semiconductor light emitters, respectively, by removing the substrate; and
   forming a plurality of wavelength converters in the plurality of grooves.

2. The method of manufacturing a light emitting device package as claimed in claim 1, wherein the insulating material is a material having a first modulus lower than a second modulus of the semiconductor laminate.

3. The method of manufacturing a light emitting device package as claimed in claim 2, wherein the insulating material includes polyimide (PI), polycyclohexylenedimethylene terephthalate (PCT), or an epoxy molding compound (EMC).

4. The method of manufacturing a light emitting device package as claimed in claim 1, wherein the plurality of semiconductor light emitters and the plurality of wavelength converters respectively correspond to each other to form a plurality of subpixels, and one pixel including the plurality of subpixels has a pixel density of 8000 pixels per inch (PPI).

5. The method of manufacturing a light emitting device package as claimed in claim 1, wherein:
   the first molding is formed of a material including polycyclohexylenedimethylene terephthalate (PCT) or an epoxy molding compound (EMC), and
   the second molding is formed of a material including polyimide (PI).

6. The method of manufacturing a light emitting device package as claimed in claim 1, wherein:
   the ITO layer is formed on the second conductive semiconductor layer prior to separating the semiconductor laminate into a plurality of semiconductor light emitters; and
   the insulating layer is formed on the ITO layer.

7. A method of manufacturing a display panel, the method comprising:
   preparing a first substrate structure such that the first substrate structure includes:
   a plurality of semiconductor light emitters having a first conductive semiconductor layer, an active layer, and at least one second conductive semiconductor layer on a first substrate,
   electrode pads connected to the first conductive semiconductor layer and the at least one second conductive semiconductor layer, of the plurality of semiconductor light emitters, respectively, and
   a molding including a material that covers the plurality of semiconductor light emitters;
   preparing a second substrate structure including a plurality of TFT cells on a second substrate, the plurality of TFT cells respectively corresponding to the plurality of semiconductor light emitters;
   bonding the first substrate structure to the second substrate structure at a process temperature, to connect the electrode pads of the first substrate structure to connectors of the second substrate structure, respectively;
   forming a plurality of grooves separated by the molding and overlying the plurality of semiconductor light emitters, respectively, by removing the first substrate; and
   forming a plurality of wavelength converters in each of the plurality of grooves, wherein the molding is formed of a material having a first modulus lower than a second modulus of the semiconductor light emitters, the first substrate and the second substrate are formed of a semiconductor substrate, the first substrate and the second substrate have etch selectivities that are different from each other, and the first substrate is doped with boron at a higher concentration than a concentration of boron at which the second substrate is doped.

8. The method of manufacturing a display panel as claimed in claim 7, wherein each of the plurality of semiconductor light emitters emit light having substantially the same wavelength.

9. The method of manufacturing a display panel as claimed in claim 7, wherein each of the plurality of semiconductor light emitters are substantially the same size.

10. The method of manufacturing a display panel as claimed in claim 7, wherein:

the plurality of semiconductor light emitters and the plurality of wavelength converters respectively correspond to each other to form a plurality of subpixels, and one pixel including the plurality of subpixels has density equal to or more than 8000 pixels per inch (PPI).

11. The method of manufacturing a display panel as claimed in claim 7, wherein:

the molding includes:

a first molding covering the plurality of semiconductor light emitters; and a second molding formed of a material having a second melting point higher than a first melting point of the first molding, the second molding covering the first molding, and the second melting point of the second molding is higher than the process temperature of the bonding of the first substrate structure to the second substrate structure.

12. A method of manufacturing a display panel, the method comprising:

preparing a first substrate structure such that the first substrate structure includes:

a plurality of semiconductor light emitters having a first conductive semiconductor layer, an active layer, and at least one second conductive semiconductor layer on the first substrate structure, electrode pads connected to the first conductive semiconductor layer and the at least one second conductive semiconductor layer, of the plurality of semiconductor light emitters, respectively, and a molding including a material that covers the plurality of semiconductor light emitters;

preparing a second substrate structure including a plurality of TFT cells on a second substrate, the plurality of TFT cells respectively corresponding to the plurality of semiconductor light emitters;

bonding the first substrate structure to the second substrate structure at a process temperature, to connect the electrode pads of the first substrate structure to connectors of the second substrate structure, respectively;

forming a plurality of grooves separated by the molding and overlying the plurality of semiconductor light emitters, respectively, by removing the first substrate structure; and forming a plurality of wavelength converters in each of the plurality of grooves, wherein:

the molding is formed of a material having a first modulus lower than a second modulus of the semiconductor light emitters, the molding includes:

a first molding covering the plurality of semiconductor light emitters; and a second molding formed of a material having a second melting point higher than a first melting point of the first molding, the second molding covering the first molding, and the second melting point of the second molding is higher than the process temperature of the bonding of the first substrate structure to the second substrate structure.

* * * * *